(12) United States Patent
Kojima et al.

(10) Patent No.: US 7,830,191 B2
(45) Date of Patent: Nov. 9, 2010

(54) VERNIER DELAY CIRCUIT

(75) Inventors: Shoji Kojima, Tokyo (JP); Masakatsu Suda, Tokyo (JP)

(73) Assignee: Advantest Corporation, Tokyo (JP)

( * ) Notice: Subject to any disclaimer, the term of this patent is extended or adjusted under 35 U.S.C. 154(b) by 57 days.

(21) Appl. No.: 12/396,219

(22) Filed: Mar. 2, 2009

(65) Prior Publication Data

US 2009/0273384 A1 Nov. 5, 2009

(30) Foreign Application Priority Data

Mar. 28, 2008 (JP) .............................. 2008-088016

(51) Int. Cl.
*H03H 11/26* (2006.01)
(52) U.S. Cl. ...................... 327/262; 327/261; 327/284
(58) Field of Classification Search .......... 327/261–264
See application file for complete search history.

(56) References Cited

U.S. PATENT DOCUMENTS

| | | | | |
|---|---|---|---|---|
| 4,494,021 A | | 1/1985 | Bell et al. ................... 307/591 |
| 5,684,421 A | * | 11/1997 | Chapman et al. ............ 327/261 |
| 6,819,157 B2 | * | 11/2004 | Cao et al. .................... 327/262 |
| 7,015,740 B1 | * | 3/2006 | Feinberg et al. ............. 327/270 |
| 7,411,436 B2 | * | 8/2008 | Fang et al. ................... 327/262 |
| 7,535,273 B2 | * | 5/2009 | Suda .......................... 327/156 |

FOREIGN PATENT DOCUMENTS

WO WO 03/036796 A1 1/2003

\* cited by examiner

*Primary Examiner*—Hai L Nguyen
(74) *Attorney, Agent, or Firm*—Martine Penilla & Gencarella, LLP

(57) ABSTRACT

A ring oscillator oscillates at a frequency determined by an input bias signal. A bias signal adjusting unit produces a bias signal for the ring oscillator using feedback so that the oscillation frequency of the ring oscillator matches a predetermined reference frequency. An individual bias circuit includes a plurality of bias circuits provided for a total of N second variable delay elements, respectively. The bias circuits are configured such that the bias signals can be individually adjusted.

7 Claims, 7 Drawing Sheets

200a

60

VERNIER DELAY CIRCUIT

The present application is claiming priority of Japanese Patent Application No. 2008-088016, filed on Mar. 28, 2008, the content of which is incorporated herein by reference.

BACKGROUND OF THE INVENTION

1. Field of the Invention

The present invention relates to a Vernier delay circuit and, more particularly, to a technology for adjusting a delay time.

2. Description of the Related Art

A time to digital converter (hereinafter, referred to as TDC) is known as a device to convert a time difference that occurs between the timing of transition of a first signal (hereinafter, referred to as a start signal) and the timing of transition of a second signal (stop signal) into a digital value. The scheme using a Vernier delay circuit in a TDC to achieve high time resolution is proposed.

FIG. 1 shows the structure of a TDC 300 where a Vernier delay circuit 200 is used. The TDC 300 comprises a Vernier delay circuit 200 and a priority encoder 100. The Vernier delay circuit 200 receives a start signal Sstart and a stop signal Sstop and produces a thermometer code TC where a change in the bits occurs at a position determined by a time difference. The Vernier delay circuit 200 comprises a first delay circuit 210 and a second delay circuit 220, and a thermometer latch TL0-TLN.

The first delay circuit 210 includes a total of N first delay elements D1 connected to form multiple stages. The circuit 210 provides a delay of a first predetermined amount t1 to the start signal Sstart in each stage and outputs a total of (N+1) delayed start signals $SA_0$-$SA_N$ delayed by different amounts. Similarly, the second delay circuit 220 includes a total of N first delay elements D2 connected to form multiple stages. The circuit 220 provides a delay of a second predetermined amount t2 to the stop signal Sstop in each stage and outputs a total of (N+1) delayed stop signals $SB_0$-$SB_N$ delayed by different amounts.

The first predetermined amount t1 of delay is set to be longer than the second predetermined amount t2. The time difference between the start signal Sstart and the stop signal Sstop is decreased by $\Delta t=(t1-t2)$ as the signals pass through a delay element of each stage in the first delay circuit 210 and the second delay circuit 220. Given that the initial time difference between the start signal Sstart and the stop signal Sstop is τ, reversal of timing of the edges of the two signals occurs when the signals have passed a total of (τ/Δt) stages of delay elements.

The thermometer latch TLj in the j-th stage (0≦j≦N) latches the delayed stop signal SBj output from the j-th stage when the delayed start signal SAj output from the j-th stage occurs. For convenience, a stage preceding the first stage will be refereed as a 0-th stage. In other words, the thermometer latch TL0 in the 0-th stage receives the start signal before being delayed and the stop signal before being delayed.

As a result, the output from the thermometer latch TL will be 0 until the stop signal Sstop catches up with the start signal Sstart. Once the stop signal catches up the start signal, the output from the thermometer latch TL0 will be 1. Thus, the data latched by a total of (N+1) thermometer latches TL0-TLN are output as the thermometer code TC [0:N]. The term thermocode derives from the fact that the bit value changes from 1 to 0 (or 0 to 1) at a particular bit in the bit series.

When the stop signal Sstop fails to catch up with the start signal Sstart, all bits of the thermometer code TC will be 0. When the stop signal Sstop is input before the start signal Sstart, all bits will be 1.

[patent document No. 1] U.S. Pat. No. 4,494,021

[patent document No. 2] WO03/36796

In the TDC of FIG. 1, the difference $\Delta t=(t1-t2)$ between the first predetermined amount t1 and the second predetermined amount t2 in the Vernier delay circuit 200 gives the resolution. Accordingly, there is a problem in that a desired resolution is not achieved when the delay amount provided by the first delay element D1 or the second delay element D2 fluctuates or varies due to fluctuation in the process, temperature, or power supply voltage.

A Vernier delay circuit may be used in applications other than a TDC and it is desirable that the time difference Δt remain constant in other applications as well.

SUMMARY OF THE INVENTION

The present invention addresses the problem and a purpose thereof is to provide a Vernier delay circuit that allows highly precise calibration.

One embodiment of the present invention relates to a Vernier delay circuit that provides different multiple-stage delays to a first signal and a second signal. The Vernier delay circuit comprises: a first delay circuit configured such that a plurality of first variable delay elements, each operative to provide a delay determined by a bias signal to an input signal, are connected to form multiple stages; a second delay circuit configured such that a plurality of second variable delay elements, each operative to provide a delay determined by a bias signal to an input signal, are connected to form multiple stages; a ring oscillator; a bias signal adjusting unit; and an individual bias circuit. The first delay circuit provides a delay of a first predetermined amount to the first signal in each stage comprising the first variable delay element, and outputs a plurality of first delayed signals delayed by different amounts. The second delay circuit provides a delay of a second predetermined amount to the second signal in each stage comprising the second variable delay element, and outputs a plurality of second delayed signals delayed by different amounts. The ring oscillator oscillates at a frequency determined by a bias signal. The bias signal adjusting unit adjusts the bias signal for the ring oscillator using feedback so that an oscillation frequency of the ring oscillator matches a reference frequency. The individual bias circuit produces a plurality of bias signals that should be provided to the plurality of second variable delay elements individually. In the Vernier delay circuit, at least the bias signal produced by the bias signal adjusting unit is provided to the plurality of first variable delay elements, and each of the plurality of second variable delay elements is provided with a composite bias signal derived from superimposing the individual bias signal produced by the individual bias circuit, on the bias signal produced by the bias signal adjusting unit.

In a Vernier delay circuit, the absolute precision of the first delay amount t1 provided by the first variable delay element in each stage and the second delay amount t2 provided by the second variable delay element is not called for. What is needed is to maintain a difference between the delay amounts (hereinafter, referred to as differential delay) $\Delta t=(t1-t2)$ at a constant level. Therefore, the differential delay Δt in each stage is brought to a target level, using the individual bias circuit, while canceling variation in the delay amounts t1 and t2 due to temperature variation and power supply variation, using the bias signal from the bias signal adjusting unit. Accordingly, highly precise calibration is achieved.

The Vernier delay circuit according to one embodiment may further comprise: a common bias circuit operative to produce a bias signal that should be commonly provided to the plurality of first variable delay elements. The Vernier delay circuit may provide the plurality of first variable delay elements with a composite bias signal derived from superimposing the bias signal produced by the common bias circuit, on the bias signal produced by the bias signal adjusting unit.

In this way, the central value of the delay adjustment range of the first variable delay elements, i.e., the central value of the differential delay $\Delta t$ is adjusted.

The Vernier delay circuit according to one embodiment may further comprise: a first tap selector operative to receive the plurality of first delayed signals output from the first delay circuit and to select and output one of the signals; a second tap selector operative to receive the plurality of second delayed signals output from the second delay circuit and to select and output one of the signals; a loop input selector operative to receive an output signal from the first tap selector and an output signal from the second tap selector and to select and output one of the output signals; a first input selector operative to receive the first signal and the signal from the loop input selector, to select one of the signals, and to output the selected signal to the first delay circuit; a second input selector operative to receive the second signal and the signal from the loop input selector, to select one of the signals, and to output the selected signal to the second delay circuit; and a frequency counter operative to measure a frequency of the output signal from the loop input selector. A loop including the first delay circuit forms a first oscillator and a loop including the second delay circuit forms a second oscillator.

The Vernier delay circuit according to one embodiment may further comprise an inverter operative to invert the output from the loop selector to form the first and second oscillators.

According to this embodiment, the period of the first oscillator including the first variable delay elements in the first delay circuit and the period of the second oscillator including the second variable delay elements in the second delay circuit are measured. By switching tap positions using the tap selectors, the number of stages of delay elements included in the loop is arbitrarily selected so that the delay amount in a single stage comprising the delay element is measured and adjusted.

The Vernier delay circuit according to one embodiment further comprises a controller operative to control the first and second tap selectors, the loop input selector, and the first and second input selectors. The controller is operative to: allow the frequency counter to measure a period $TA_0$ while the first input selector is selecting the signal from the loop input selector, the loop input selector is selecting the output signal from the first tap selector, and the first tap selector is selecting a tap in a 0-th stage; and allow the frequency counter to measure a period $TB_0$ while the second input selector is selecting the signal from the loop input selector, the loop input selector is selecting the output signal from the second tap selector, and the second tap selector is selecting a tap in the 0-th stage. The controller further repeats, while increasing i in increments of 1, the steps of: i) allowing the frequency counter to measure a period $TA_i$ while the first input selector is selecting the signal from the loop input selector, the loop input selector is selecting the output signal from the first tap selector, and the first tap selector is selecting a tap in an i-th stage ($1 \leq i \leq N$); ii) computing a difference $\Delta TA_i$ between a period $TA_i$ and the period $TA_0$; iii) allowing the frequency counter to measure a period $TB_i$ while the second input selector is selecting the signal from the loop input selector, the loop input selector is selecting the output signal from the second tap selector, and the second tap selector is selecting a tap in the i-th stage; iv) computing a difference $\Delta TB_i$ between a period $TB_i$ and the period $TB_0$; and v) adjusting the bias signal that should be provided by the individual bias circuit to the second variable delay element in the i-th stage of the second delay circuit so that a difference between the difference $\Delta TA_i$ and the difference $\Delta TB_i$ obeys a relation $\Delta TA_i - \Delta TB_i = \Delta t \times i$, where $\Delta t$ denotes a predetermined differential delay.

The Vernier delay circuit according to one embodiment further comprises: a plurality of latches corresponding to respective pairs each comprising the first variable delay element and the second variable delay element. Each latch latches an input signal of the corresponding second variable delay element, using an input signal of the corresponding first variable delay element.

Another embodiment of the present invention relates to a time to digital converter that converts a time difference that occurs between the timing of transition of a start signal and the timing of transition of a stop signal into a digital value. The time to digital converter comprises: a Vernier delay circuit operative to receive the start signal as the first signal and receive the stop signal as the second signal; and an encoder operative to encode a thermometer code output from the Vernier delay circuit.

According to this embodiment, a differential delay $\Delta t$ in each stage of a Vernier delay circuit is maintained at a target level. Therefore, high time resolution is achieved.

Still another embodiment of the present invention relates to a test apparatus. The test apparatus comprises the time to digital converter described above.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. In the same way, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

First Embodiment

Figure 1:
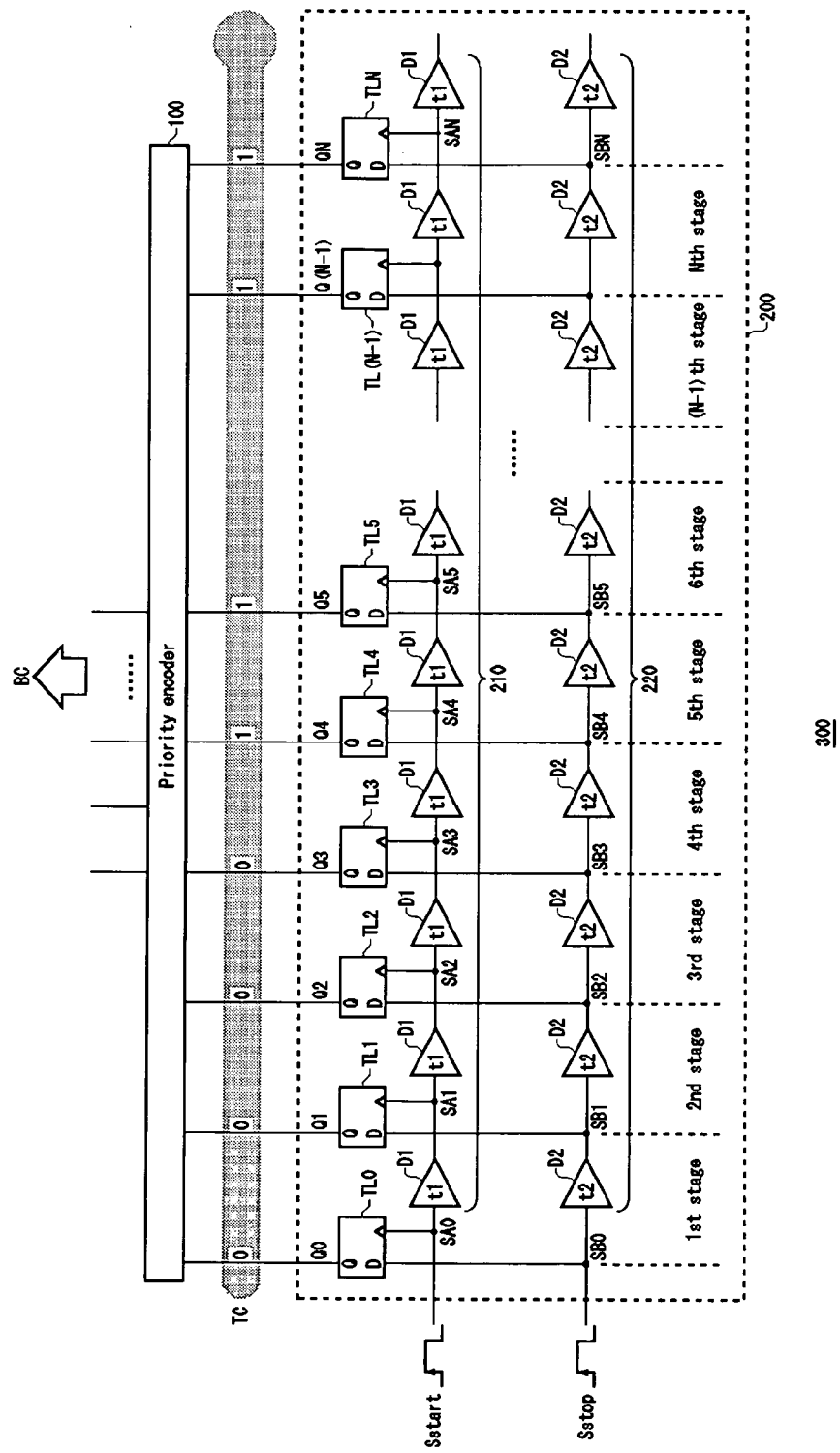
FIG. 1 shows the structure of a TDC where a Vernier delay circuit is used.
Figure 2:
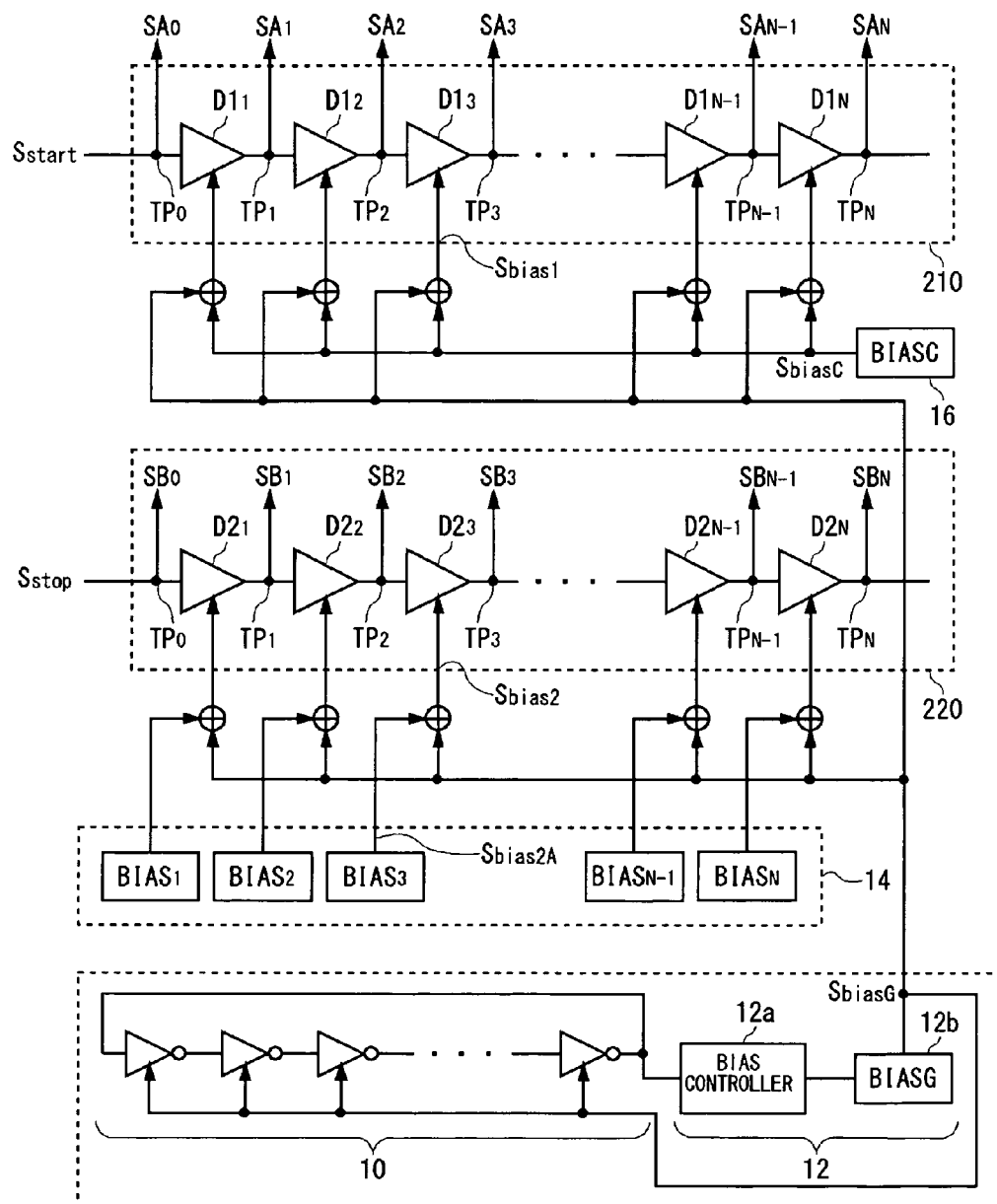
FIG. 2 is a block diagram showing the structure of a Vernier delay circuit according to the first embodiment.

FIG. 2 is a block diagram showing the structure of a Vernier delay circuit $200a$ according to the first embodiment. The Vernier delay circuit $200a$ is suitably used in the TDC $300$ of FIG. 1. The TDC $300$ is provided in test apparatuses like automatic test equipment (ATE), time interval analyzers, and jitter measuring devices.

The Vernier delay circuit $200a$ of FIG. 2 receives a start signal (first signal) Sstart and a stop signal (second signal) Sstop and provides different multi-stage delays to the two signals.

The Vernier delay circuit $200$ comprises a first delay circuit $210$, a second delay circuit $220$, a ring oscillator $10$, a bias signal adjusting unit $12$, an individual bias circuit $14$, and a common bias circuit $16$.

The first delay circuit $210$ includes a total of N first variable delay elements $D1_1$-$D1_N$ connected to form multiple stages, where N denotes a natural number. The variable delay elements $D1_1$-$D1_N$ provide a delay determined by bias signals $Sbias1_1$-$Sbias1_N$ to the input signals. The first delay circuit $210$ provides a delay of a first predetermined amount t1 to the start signal Sstart in each stage comprising the first variable delay element. A tap $TP_i$ is provided at the output terminal of the variable delay element D1 in the i-th stage ($0 \leq i \leq$) so that plurality of delayed start signals $SA_0$-$SA_N$, delayed by different amounts, are output from the taps $TP_0$-$TP_N$. The 0-th stage corresponds to the input in the first stage, i.e., a stage where the signal is not delayed.

The second delay circuit $220$ includes a total of N second variable delay elements $D2_1$-$D2_N$ connected to form multiple stages. The variable delay elements $D2_1$-$D2_N$ provide a delay determined by bias signals $Sbias2_1$-$Sbias2_N$ to the input signals. The second delay circuit $220$ provides a delay of a second predetermined amount t2 to the stop signal Sstop in each stage comprising the second variable delay element. A tap $TP_i$ is provided at the output terminal of the variable delay element D2 in the i-th stage ($0 \leq i \leq N$). A plurality of delayed stop signals $SB_0$-$SB_N$, delayed by different amounts, are output from the taps $TP_0$-$TP_N$.

A ring oscillator $10$ oscillates at a frequency determined by an input bias signal SbiasG. The bias signal adjusting unit $12$ produces a bias signal SbiasG for the ring oscillator $10$ using feedback so that the oscillation frequency of the ring oscillator $10$ matches a predetermined reference frequency. The bias signal adjusting unit $12$ includes a feedback controller $12a$ and a bias circuit $12b$. The bias circuit $12b$ produces a bias signal SbiasG The feedback controller $12a$ controls the bias circuit $12b$ so that the oscillation frequency of the ring oscillator $10$ matches the reference frequency. The bias signal adjusting unit $12$ may be formed using the publicly known technology.

The individual bias circuit $14$ comprises a plurality of bias circuits $BIAS_1$-$BIAS_N$ provided for the N second variable delay elements $D2_1$-$D2_N$, respectively. The bias circuit $BIAS_i$ in the i-th stage ($1 \leq i \leq N$) produces a bias signal $Sbias2A_i$ that should be provided to the corresponding second variable delay element $D2_i$. The bias circuits $BIAS_1$-$BIAS_N$ are configured such that the bias signals $Sbias2A_1$-$Sbias2A_N$ can be individually adjusted.

The common bias circuit $16$ produces a bias signal SbiasC that should be given in common to the plurality of first variable delay elements $D1_1$-$D1_N$.

The plurality of first variable delay elements $D1_1$-$D1_N$ are provided with at least the bias signal SbiasG produced by the bias signal adjusting unit $12$. According to the first embodiment, a composite bias signal derived from superimposing the bias signal SbiasC produced by the common bias circuit $16$ on the bias signal SbiasG produced by the bias signal adjusting unit $12$ is provided.

The composite bias signal $Sbias2_i$ is supplied to the second variable delay element $D2_i$ in the i-th stage. The composite bias signal $Sbias2_i$ is produced by superimposing the bias signal $Sbias2A_i$ produced by the individual bias circuit $14$ on the bias signal SbiasG produced by the bias signal adjusting unit $12$.

Figure 3:
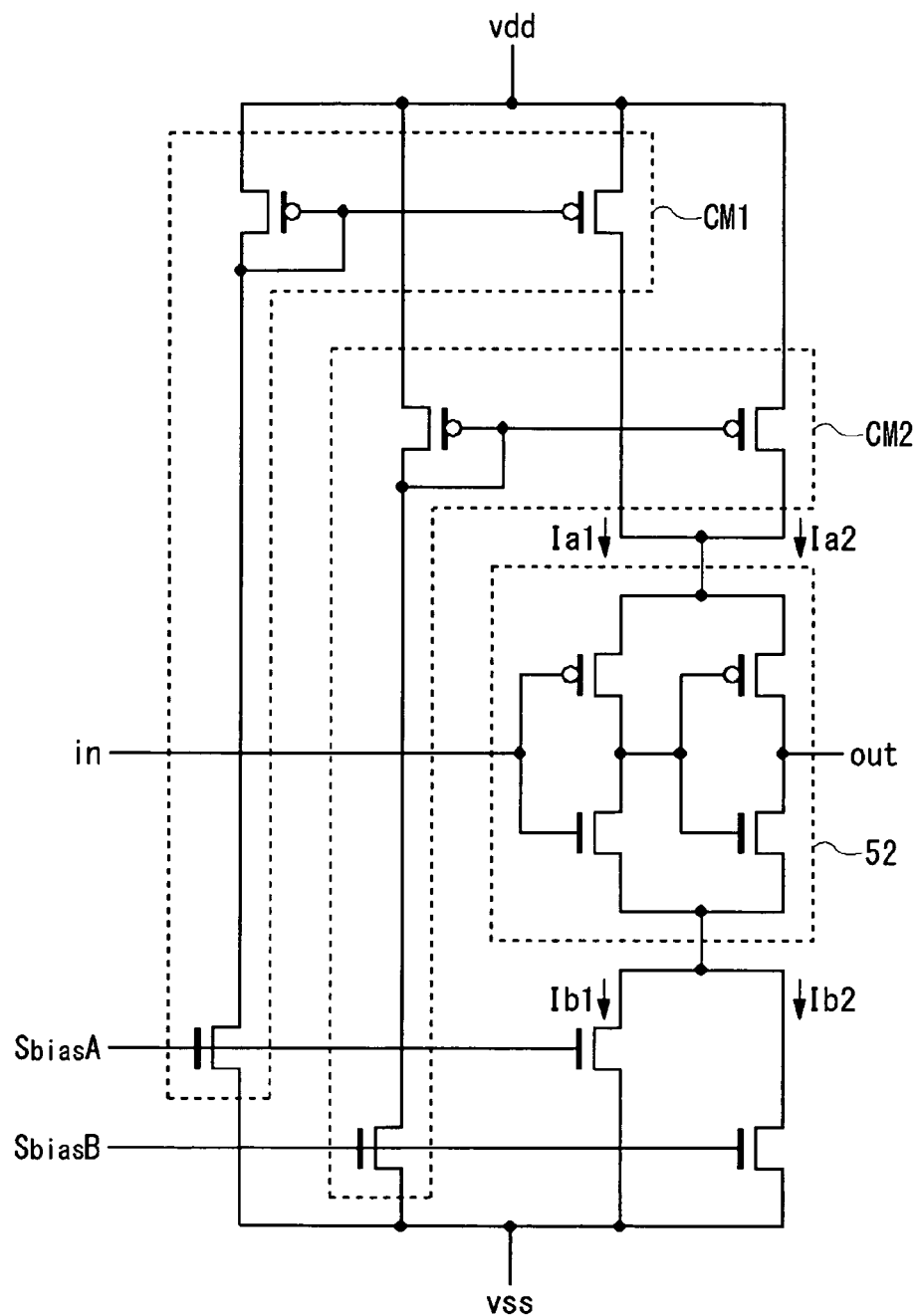
FIG. 3 is a circuit diagram showing the structure of a variable delay element that provides a delay determined by two bias signals.

The circuit disclosed in patent document No. 2 may be used as the first variable delay element D1 and the second variable delay element D2. FIG. 3 is a circuit diagram showing the structure of a variable delay element $50$ that provides a delay determined by two bias signals. A first current mirror circuit CM1 produces a bias current Ia1 determined by the first bias signal SbiasA and a second current mirror circuit CM2 produces a bias current Ia2 determined by the second bias signal SbiasB. The two bias currents Ia1 and Ia2 are combined and supplied to a terminal on the high potential side of an inverter $52$, which functions as a buffer due to its two-stage configuration. Similarly, two current sources are provided on the low potential side of the inverter $52$. The bias current Ib1 determined by the first bias signal SbiasA and the bias signal Ib2 determined by the second bias signal SbiasB are combined and the combined signal is pulled from the terminal on the low potential side of the inverter $52$.

Figure 4:
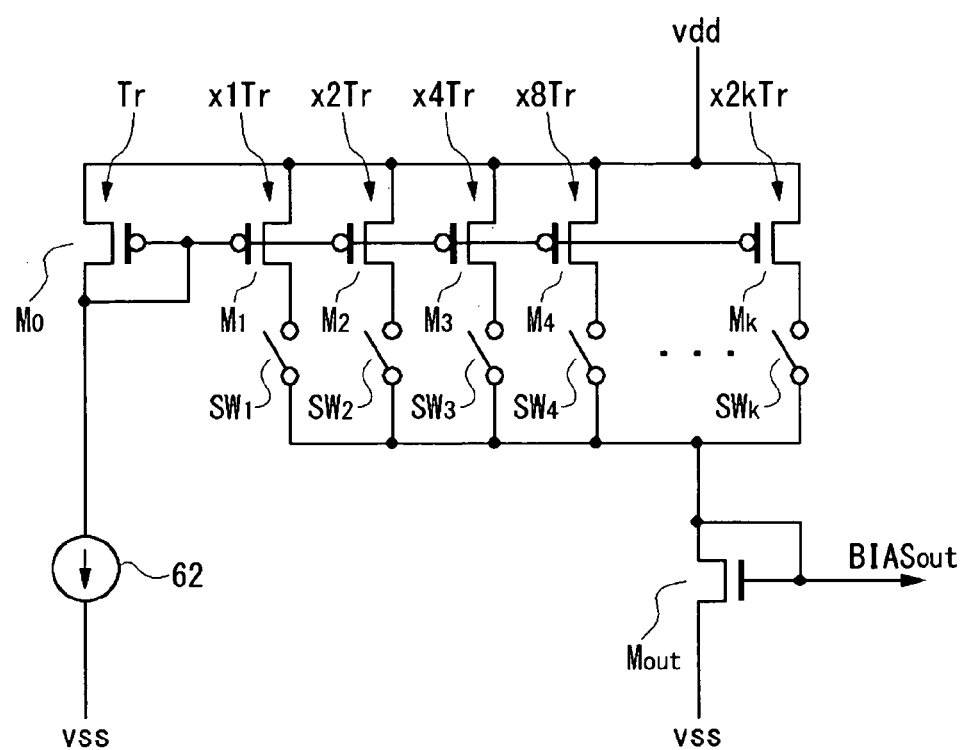
FIG. 4 is a circuit diagram showing the structure of a bias circuit that supplies a bias signal to the variable delay element of FIG. 3.

FIG. 4 is a circuit diagram showing the structure of a bias circuit that supplies a bias signal to the variable delay element of FIG. 3. The bias circuit $60$ of FIG. 4 is also disclosed in patent document No. 2. The bias circuit $60$ includes a reference current source $62$, transistors $M_0$-$M_k$, switches $SW_1$-$SW_k$, and a transistor Mout, where k denotes an integer equal to or greater 2. The reference transistor $M_0$ is provided on a path including the reference current source $62$. The gates and sources of the reference transistor $M_0$ and those of the transistors $M_1$-$M_k$ are connected in common so as to form a current mirror circuit. The switches $SW_1$-$SW_k$ are provided on a path including the transistors $M_1$-$M_k$. A sum of currents through the transistors $M_1$-$M_k$ flows in the output transistor Mout, producing a bias voltage BIASout at the gate of the output transistor Mout.

Given that the reference transistor $M_0$ has a size Tr, the size of the transistor $M_i$ in the i-th stage ($1 \leq i \leq k$) is set to $2^i \times Tr$. The bias signal BIASout is controlled by controlling the on and off of the switches $SW_1$-$Sw_k$ individually. The bias circuit other than that of FIG. 4 may be used.

Figure 5:
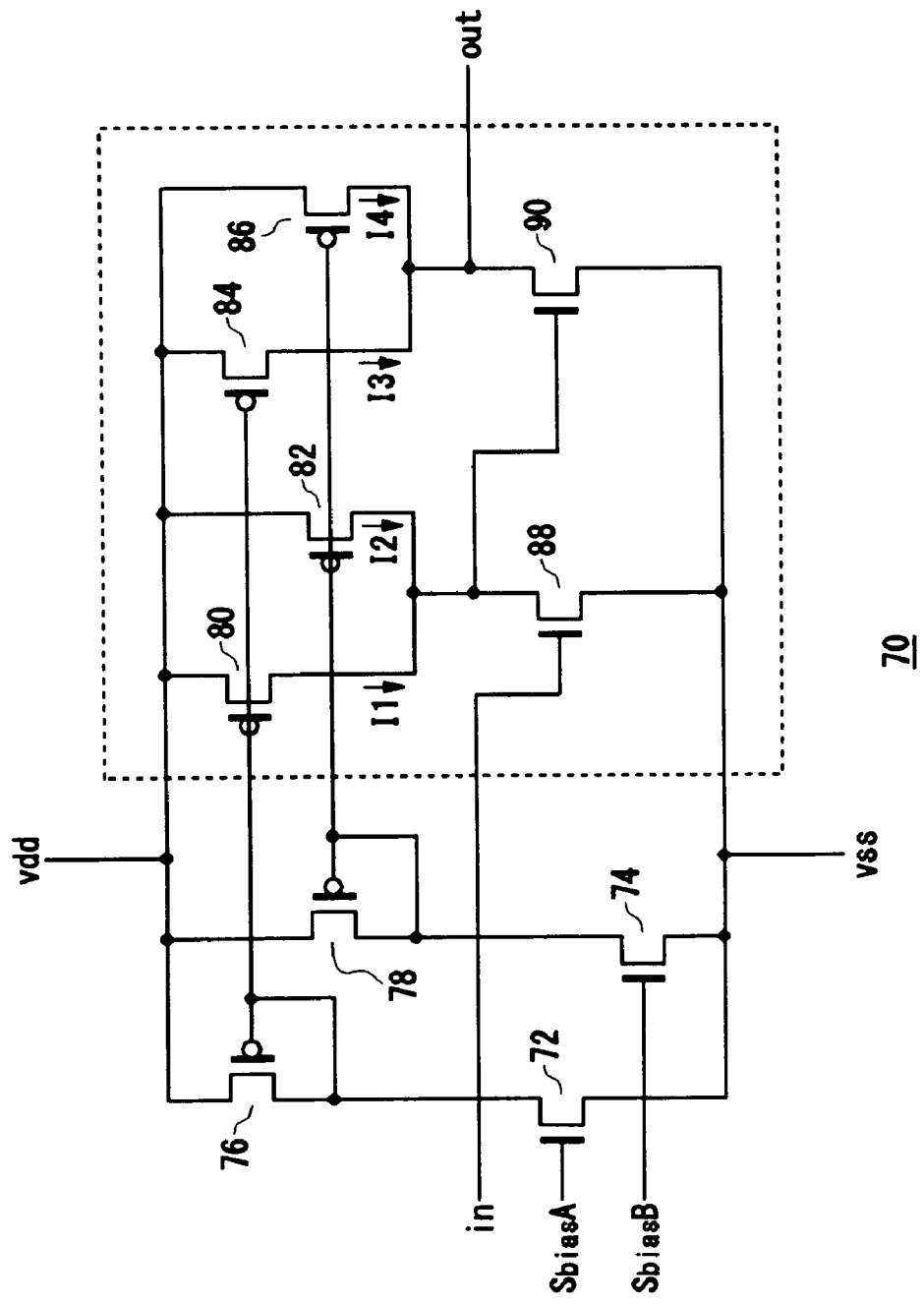
FIG. 5 is a circuit diagram showing another structure of the variable delay element.

FIG. 5 is a circuit diagram showing another structure of the variable delay element. A variable delay element $70$ includes transistors 72-90. The transistors 72, 74, 88, and 90 are N-channel MOSFETs. The transistors 76, 78, 80, 82, 84, and 86 are P-channel MOSFETs.

The bias signal SbiasA is fed to the gate of the transistor 72. The bias signal SbiasB is fed to the gate of the transistor 74. The transistors 72, 76, and 80 form a current mirror circuit, which produces a current I1 determined by the bias signal SbiasA. Similarly, the transistors 74, 78, and 82 form a current mirror circuit, which produces a current I2 determined by the bias signal SbiasB. The transistors 72, 76, and 84 form a current mirror circuit, which produces a current I3 determined by the bias signal SbiasA. The transistors 74, 78, and 86 form a current mirror circuit, which produces a current I4 determined by the bias signal SbiasB.

The transistors 80, 82, and 88 form an inverter in the first stage. The transistors 84, 86, and 90 form an inverter in the second stage. The transistors 80 and 82 function as a load of the transistor 88. The transistors 84 and 86 function as a load of the transistor 90. The input signal "in" is fed to the gate of the transistor 88. The drain of the transistor 88 is connected to the gate of the transistor 90. Hence the signal "out" is generated as a delayed signal of the input signal "in".

The variable delay element 70 of FIG. 5 is capable of providing a delay determined by the bias signals SbiasA and SbiasB to an input signal in. The variable delay element 70 of FIG. 5 is advantageously operated at a low voltage because it includes a smaller number of transistors in cascade connection than the variable delay element 50 of FIG. 3. Semiconductor integrated circuits that are recently available are operated at lower power supply voltages. Therefore, the variable delay element 70 of FIG. 5 will be useful.

Described above is the structure of the Vernier delay circuit 200a according to the first embodiment. Generally, a differential delay Δt between the first delay amount t1 provided by the first variable delay element D1 in each stage of a Vernier delay circuit and the second delay amount t2 provided by the second variable delay element D2 needs to be maintained at a constant level.

Since the second delay amount $t2_i$ in each stage of the Vernier delay circuit 200a according to the first embodiment can be individually adjusted using the individual bias circuit 14, the differential delay $\Delta t_i = t1_i - t2_i$ in each stage is calibrated. Further, variation in the delay amounts t1 and t2 due to temperature variation and power supply variation is canceled by the bias signal SbiasG from the bias signal adjusting unit 12. Accordingly, highly precise calibration is achieved.

The Vernier delay circuit 200a provides the same bias signal SbiasG to the first delay circuit 210 and the second delay circuit 220. If a ring oscillator is provided in each of the first delay circuit 210 and the second delay circuit 220 to subject the bias to first delay circuit 210 and the second delay circuit 220 to feedback control, the differential delay $\Delta t_i = t1_i - t2_i$ is subject to variation given that the two ring oscillators are only weakly correlated. In contrast, the Vernier delay circuit 200 according to the first embodiment is operable to increase the correlation between the delay amounts provided by the first delay circuit 210 and the second delay circuit 220 by providing the common bias signal SbiasG.

By providing the common bias circuit 16, the central value of the delay adjustment range of the first variable delay element D1, i.e., the central value of the differential delay Δt, can be adjusted. If the delay adjustment range of the first variable delay element D1 and the second variable delay element D2 is sufficiently large, there is no need to provide the common bias circuit 16.

Second Embodiment

In addition to the function of the Vernier delay circuit 200a, the Vernier delay circuit 200b according to the second embodiment is provided with the function of suitably calibrating the differential delay Δt.

Figure 6:
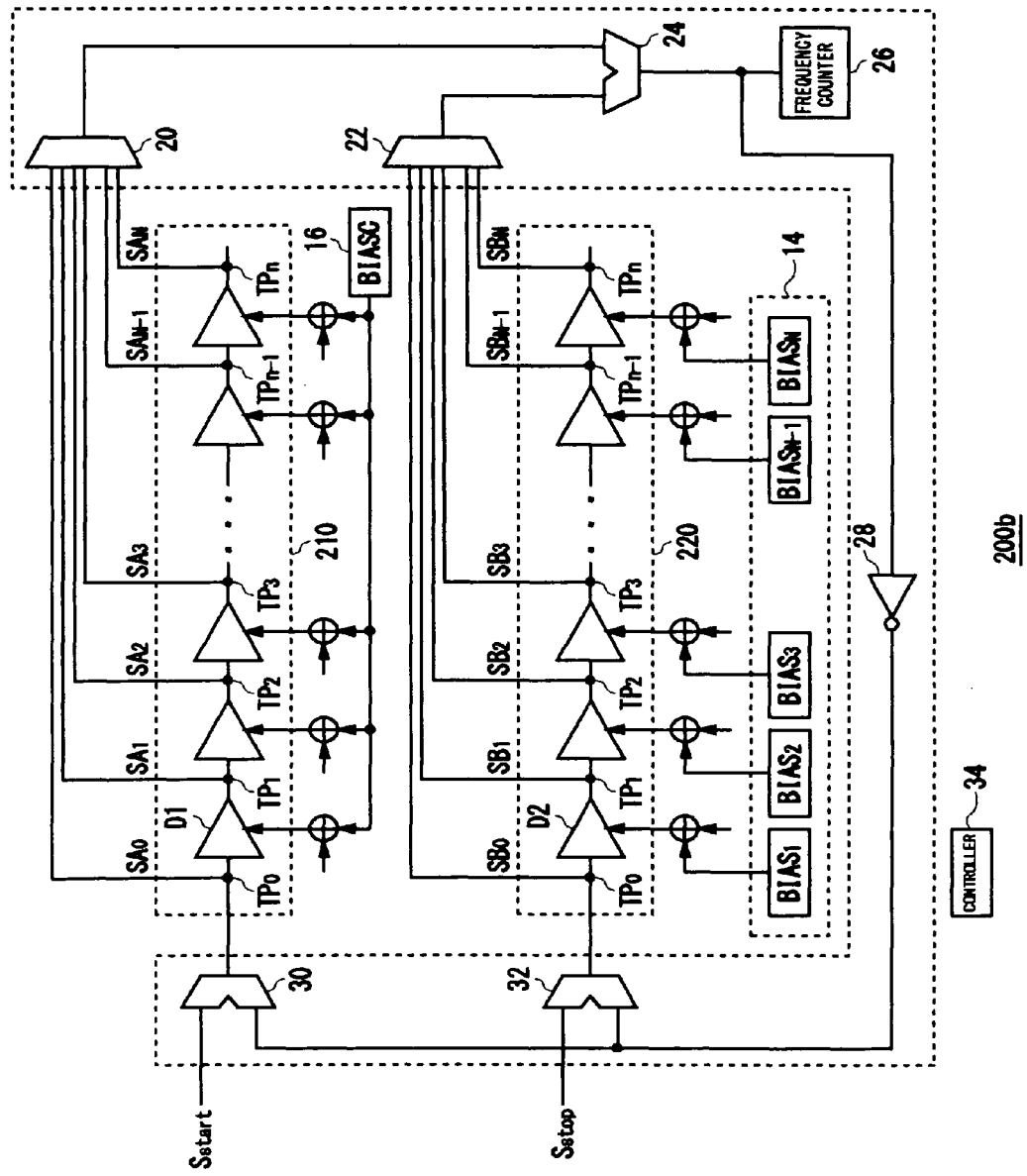
FIG. 6 is a circuit diagram showing the structure of the Vernier delay circuit according to the second embodiment.

FIG. 6 is a circuit diagram showing the structure of the Vernier delay circuit 200b according to the second embodiment. FIG. 6 does not show the ring oscillator 10 or the bias signal adjusting unit 12.

In addition to the features of the Vernier delay circuit 200a of FIG. 2, the Vernier delay circuit 200b comprises a first tap selector 20, a second tap selector 22, a loop input selector 24, a frequency counter 26, an inverter 28, a first input selector 30, a second input selector 32, and a controller 34.

The first tap selector 20 receives a plurality of first delayed start signals $SA_0$-$SA_N$ output from the first delay circuit 210, and selects and outputs one of the signals. The second tap selector 22 receives the plurality of second delayed start signals $SB_0$-$SB_N$ output from the second delay circuit 220, and selects and outputs one of the signals.

The loop input selector 24 receives the output signal from the first tap selector 20 and the output signal from the second tap selector 22, and selects and outputs one of the signals. The first input selector 30 receives the start signal Sstart and the signal from the loop input selector 24, and selects and outputs one of the signals to the first delay circuit 210. The second input selector 32 receives the stop signal Sstop and the signal from the loop input selector 24, and selects and outputs one of the signals to the second delay circuit 220.

The frequency counter 26 measures the frequency of the output signal from the loop input selector 24.

The Vernier delay circuit 200b is configured such that the loop including the first delay circuit 210 forms the first oscillator and the loop including the second delay circuit 220 forms the second oscillator. In other words, what is needed is to ensure that the signal derived from logical inversion of the output signal from the first delay circuit 210 is fed to the input of the first delay circuit 210 via a feedback path. Similarly, the signal derived from logical inversion of the output signal from the second delay circuit 220 needs to be fed to the input of the second delay circuit 220 via a feedback path.

The inverter 28 is provided to ensure that each of the first delay circuit 210 and the second delay circuit 220 is operated as a loop oscillator.

The position of the inverter 28 is not limited to the position illustrated in FIG. 6. An inverter for inverting the output from the first tap selector 20 and an inverter for inverting the output from the second tap selector 22 may be provided.

According to the configuration as described, the first oscillator including the first delay circuit 210 is formed by allowing the loop input selector 24 to select the output from the first tap selector 20 and allowing the first input selector 30 to select the output from the inverter 28. The oscillation frequency varies depending on the delay time of the first delay circuit 210, i.e., the position of the tap selected by the first tap selector 20. Thus, the delay amounts $t1_1$-$t1_N$ of the first variable delay elements $D1_1$-$D1_N$ in the first delay circuit 210 are measured by varying the tap position sequentially. Similarly, the delay amounts $t2_1$-$t2_N$ of the second variable delay elements $D2_1$-$D2_N$ in the second delay circuit 220 are also measured. Accordingly, the differential delay $\Delta t_i = t1_i - t2_i$ is sequentially computed, starting with the first stage so as to achieve calibration.

A suitable method for calibration will be explained hereinafter. The controller 34 controls the operation of the first tap selector 20, the second tap selector 22, the loop input selector 24, the first input selector 30, and the second input selector 32.

The Vernier delay circuit 200b performs the following steps to perform calibration.

Step 1

The first input selector 30 selects the signal from the loop input selector 24 and the loop input selector 24 selects the output signal from the first tap selector 20. The first tap selector selects the tap $TP_0$ in the 0-th stage. In this state, the frequency counter 26 measures the period $TA_0$ of the first oscillator.

Step 2

The second input selector 32 selects the signal from the loop input selector 24 and the loop input selector 24 selects the output signal from the second tap selector 22. The second tap selector 22 selects the tap $TP_0$ in the 0-th stage, i.e., the delayed stop signal $SB_0$. In this state, the frequency counter 26 measures the period $TB_0$ of the second oscillator.

Subsequently, the following steps (Step 3-Step 7) are performed by increasing i from 1 to N in increments of 1.

Step 3

The first input selector 30 selects the signal from the loop input selector 24 and the loop input selector 24 selects the output signal from the first tap selector 20. The first tap selector 20 selects the tap $TP_i$ in the i-th stage. In this state, the frequency counter 26 measures the period $TA_i$ of the first oscillator.

Step 4

The difference $\Delta TA_i = (TA_i - TA_0)$ between the period $TA_i$ and the period $TA_0$ is computed.

Step 5

The second input selector 32 selects the signal from the loop input selector 24 and the loop input selector 24 selects the output signal from the second tap selector 22. The second tap selector selects the tap $TP_i$ in the i-th stage. In this state, the frequency counter 26 measures the period $TB_i$ of the second oscillator.

Step 6

The difference $\Delta TB_i = (TB_i - TB_0)$ between the period $TB_i$ and the period $TB_0$ is computed.

Step 7

Given that a predetermined differential delay is $\Delta t$, the bias signal that should be provided by the individual bias circuit 14 to the second variable delay element $D2_i$ in the i-th stage of the second delay circuit 220 is adjusted so that the difference between the difference $\Delta TA_i$ and the difference $\Delta TB_i$ obeys the relation $\Delta TA_i - \Delta TB_i = \Delta t \times i$.

By following the above steps, the differential delay $\Delta t$ of the stages are suitably calibrated. Each step may be modified in a way that does not adversely affect the process.

Figure 7:
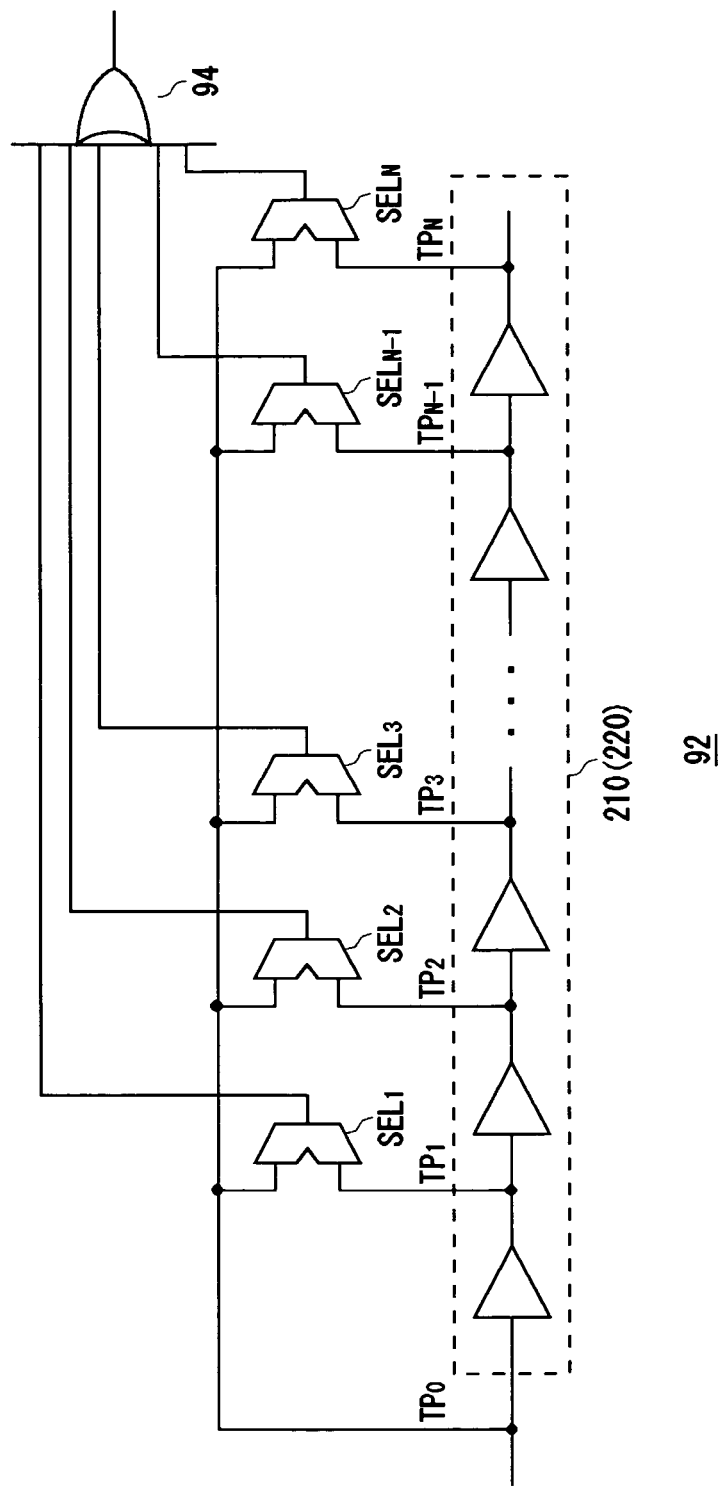
FIG. 7 is a circuit diagram showing the structure of a selector that can be used as the first tap selector or the second tap selector of the Vernier delay circuit of FIG. 6.

When different skews exist at different taps in a multi-input selector like the first tap selector 20 or the second tap selector 22, precision of calibration will become poor. FIG. 7 is a circuit diagram showing the structure of a selector that can be used as the first tap selector 20 or the second tap selector 22 of the Vernier delay circuit 200b of FIG. 6.

A selector 92 of FIG. 7 comprises selectors $SEL_1$-$SEL_N$ provided for the variable delay elements in the first through N-th stages of the delay circuit 210 (220), and also comprises an OR gate 94. The delayed signal $SA_0$ from the tap $TP_0$ in the 0-th stage and the delayed signal $SA_i$ from the tap $TP_i$ in the i-th stage are fed to the selector $SEL_i$ in the i-th stage. The outputs from the selectors $SEL_1$-$SEL_N$ are fed to the OR gate 94.

The differences $\Delta TA_i$ and $\Delta TB_i$ computed in Step 4 and Step 6 are relative time differences with reference to the signal from the tap $TP_0$ in the 0-th stage. Therefore, the signal $SA_0$ from the reference tap $TP_0$ and the signal $SA_i$ from the tap $TP_i$ in the i-th stage are delayed by the same amount in each selector $SEL_i$ before being output to the OR gate. As a result, the skew between $\Delta TA_i$ and $\Delta TB_i$ is reduced and precision of calibration is improved accordingly.

The embodiments are intended to be illustrative only and it will be obvious to those skilled in the art that various modifications to constituting elements and processes could be developed and that such modifications are also within the scope of the present invention.

While the Vernier delay circuit 200 is described as being applicable to the TDC 300, the application is not limited to this and the circuit 200 may be used in various applications that require precisely controlled relative delays.

While the preferred embodiments of the present invention have been described using specific terms, such description is for illustrative purposes only, and it is to be understood that changes and variations may be made without departing from the spirit or scope of the appended claims.

What is claimed is:

1. A Vernier delay circuit that provides different multiple-stage delays to a first signal and a second signal, comprising:

a first delay circuit configured such that a plurality of first variable delay elements, each operative to provide a delay determined by a bias signal to an input signal, are connected to form multiple stages, the circuit providing a delay of a first predetermined amount to the first signal in each stage comprising the first variable delay element, and outputting a plurality of first delayed signals delayed by different amounts;

a second delay circuit configured such that a plurality of second variable delay elements, each operative to provide a delay determined by a bias signal to an input signal, are connected to form multiple stages, the circuit providing a delay of a second predetermined amount to the second signal in each stage comprising the second variable delay element, and outputting a plurality of second delayed signals delayed by different amounts;

a ring oscillator operative to oscillate at a frequency determined by a bias signal;

a bias signal adjusting unit operative to adjust the bias signal for the ring oscillator using feedback so that an oscillation frequency of the ring oscillator matches a reference frequency; and an individual bias circuit operative to produce a plurality of bias signals that should be provided to the plurality of second variable delay elements individually, wherein at least the bias signal produced by the bias signal adjusting unit is provided to the plurality of first variable delay elements, and each of the plurality of second variable delay elements is provided with a composite bias signal derived from superimposing the individual bias signal produced by the individual bias circuit, on the bias signal produced by the bias signal adjusting unit.

2. The Vernier delay circuit according to claim 1, further comprising:

a common bias circuit operative to produce a bias signal that should be commonly provided to the plurality of first variable delay elements, wherein each of the plurality of first variable delay elements is provided with a composite bias signal derived from superimposing the bias signal produced by the common bias circuit, on the bias signal produced by the bias signal adjusting unit.

3. The Vernier delay circuit according to claim 1, further comprising:
a first tap selector operative to receive the plurality of first delayed signals output from the first delay circuit and to select and output one of the signals;
a second tap selector operative to receive the plurality of second delayed signals output from the second delay circuit and to select and output one of the signals;
a loop input selector operative to receive an output signal from the first tap selector and an output signal from the second tap selector and to select and output one of the output signals;
a first input selector operative to receive the first signal and the signal from the loop input selector, to select one of the signals, and to output the selected signal to the first delay circuit;
a second input selector operative to receive the second signal and the signal from the loop input selector, to select one of the signals, and to output the selected signal to the second delay circuit; and
a frequency counter operative to measure a frequency of the output signal from the loop input selector, wherein
a loop including the first delay circuit forms a first oscillator and a loop including the second delay circuit forms a second oscillator.

4. The Vernier delay circuit according to claim 3, further comprising:
a controller operative to control the first and second tap selectors, the loop input selector, and the first and second input selectors, wherein
the controller is operative to:
allow the frequency counter to measure a period $TA_0$ while the first input selector is selecting the signal from the loop input selector, the loop input selector is selecting the output signal from the first tap selector, and the first tap selector is selecting a tap in a 0-th stage;
allow the frequency counter to measure a period $TB_0$ while the second input selector is selecting the signal from the loop input selector, the loop input selector is selecting the output signal from the second tap selector, and the second tap selector is selecting a tap in the 0-th stage; and repeat, while increasing i in increments of 1, the steps of:
i) allowing the frequency counter to measure a period $TA_i$ while the first input selector is selecting the signal from the loop input selector, the loop input selector is selecting the output signal from the first tap selector, and the first tap selector is selecting a tap in an i-th stage ($1 \leq i \leq N$);
ii) computing a difference $\Delta TA_i$ between a period $TA_i$ and the period $TA_0$;
iii) allowing the frequency counter to measure a period $TB_i$ while the second input selector is selecting the signal from the loop input selector, the loop input selector is selecting the output signal from the second tap selector, and the second tap selector is selecting a tap in the i-th stage;
iv) computing a difference $\Delta TB_i$ between a period $TB_i$ and the period $TB_0$; and
v) adjusting the bias signal that should be provided by the individual bias circuit to the second variable delay element in the i-th stage of the second delay circuit so that a difference between the difference $\Delta TA_i$ and the difference $\Delta TB_i$ obeys a relation $\Delta TA_i - \Delta TB_i = \Delta t \times i$, where $\Delta t$ denotes a predetermined differential delay.

5. The Vernier delay circuit according to claim 1, further comprising:
a plurality of latches corresponding to respective pairs each comprising the first variable delay element and the second variable delay element, wherein
each latch latches an input signal of the corresponding second variable delay element, using an input signal of the corresponding first variable delay element.

6. A time to digital converter that converts a time difference that occurs between the timing of transition of a start signal and the timing of transition of a stop signal into a digital value, comprising:
the Vernier delay circuit according to claim 5 operative to receive the start signal as the first signal and receive the stop signal as the second signal; and
an encoder operative to encode a thermometer code output from the Vernier delay circuit.

7. A test apparatus comprising the time to digital converter according to claim 6.

* * * * *